United States Patent [19]

Ohno et al.

[11] Patent Number: 4,974,185

[45] Date of Patent: Nov. 27, 1990

[54] DIGITAL FILTER FOR EXECUTING A VIDEO EMPHASIS PROCESS THROUGH MODE SELECTION

[75] Inventors: Tatsuyuki Ohno, Fukaya; Masahiko Mawatari, Yokohama, both of Japan

[73] Assignee: Kabushiki Kaisha Toshiba, Kawasaki, Japan

[21] Appl. No.: 330,361

[22] Filed: Mar. 29, 1989

[30] Foreign Application Priority Data

Mar. 30, 1988 [JP] Japan .................................. 63-76909

[51] Int. Cl.$^5$ .............................................. H04N 9/79
[52] U.S. Cl. .................................. 364/724.13; 358/310
[58] Field of Search ....................... 364/724.01, 724.13, 364/724.17; 358/310, 327

[56] References Cited

U.S. PATENT DOCUMENTS

| | | | |
|---|---|---|---|
| 4,658,305 | 4/1987 | Tsushima | 358/327 |
| 4,751,663 | 6/1988 | Yamazaki | 364/724.01 |
| 4,777,612 | 10/1988 | Tomimitsu | 364/724.13 |
| 4,811,263 | 3/1989 | Hedley et al. | 364/724.13 |
| 4,851,928 | 7/1989 | Numakura et al. | 358/310 |

OTHER PUBLICATIONS

Wireless World, vol. k88, No. 1580, Sep. 1982, pp. 77-79, Sheepan Place Olchester, GB Y. Hirata: "Simple Digital Filters for Sound Reproduction".
Memoirs of the Faculty of Engineering Kobe University, No. 22, Mar. 1976, pp. 127-142, Kobe, JP, K. Hirano et al., "Optimum Design of Cascade Realization Digital Filters".
Patent Abstract, Japanese Application No. 59-207720, Nov. 24, 1984.

*Primary Examiner*—David H. Malzahn
*Attorney, Agent, or Firm*—Cushman, Darby & Cushman

[57] ABSTRACT

A digital filter having a characteristic expressed by a rational function executes a signal processing in a predetermined sequence in accordance with a pre-emphasis mode or de-emphasis mode. A first digital filter has a characteristic expressed by a denominator polynomial of the rational function and processes an input signal according to this characteristic to produce a first process signal. A second digital filter has a characteristic expressed by a numerator polynomial of the rational function and processes an input signal according to this characteristic to produce a second process signal. A mode selector selects one of the pre-emphasis and de-emphasis modes. A first switch supplies the input signal to the first digital filter in accordance with the pre-emphasis mode and supplies the second process signal from the second digital filter to the first digital filter in accordance with the de-emphasis mode. A second switch supplies the first process signal from the first digital filter to the second digital filter in accordance with the pre-emphasis mode and supplies the input signal to the second digital filter in accordance with the de-emphasis mode.

20 Claims, 2 Drawing Sheets

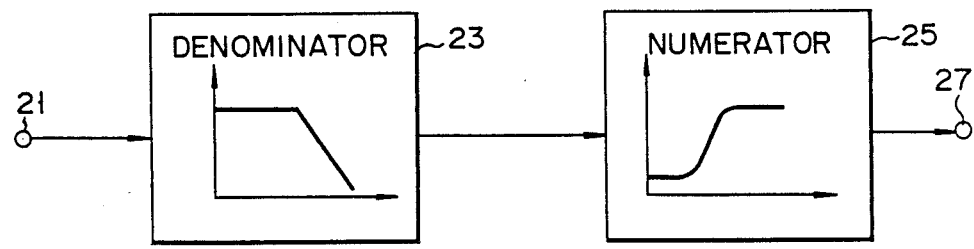
F I G. 2
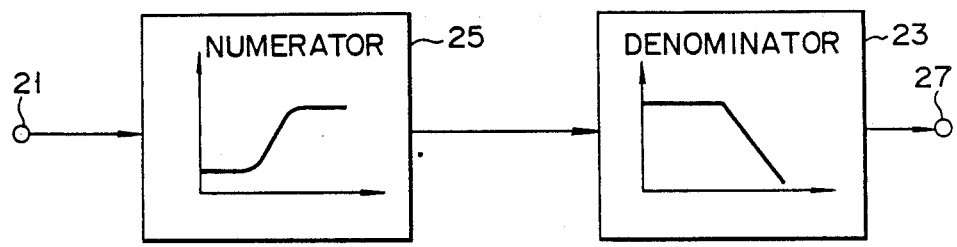
F I G. 3
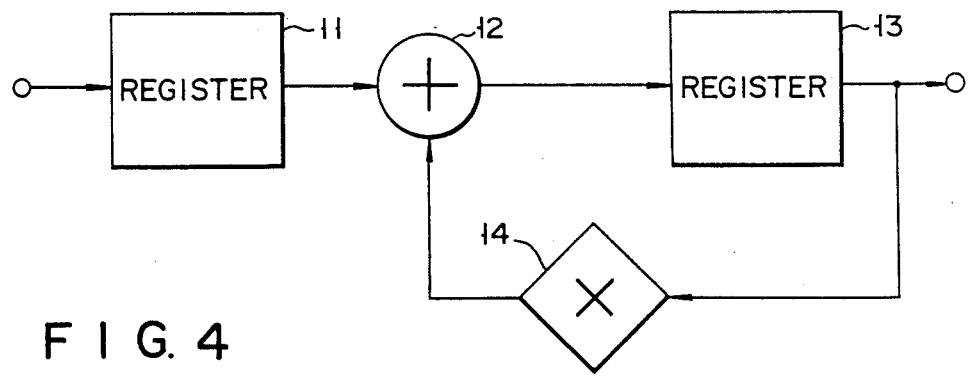
F I G. 4

DIGITAL FILTER FOR EXECUTING A VIDEO EMPHASIS PROCESS THROUGH MODE SELECTION

BACKGROUND OF THE INVENTION

1. Field of the Invention

The present invention relates to a digital filter and, more particularly, to a digital filter for use in a video emphasis circuit of, for example, a magnetic recording-/reproducing apparatus.

2. Description of the Related Art

For instance, according to a magnetic recording/reproducing apparatus which executes data recording/reproduction by using video signals of a NTSC system, a luminance signal acquired by Y/C separation is used for FM modulation at the time of data recording. At the time of data reproduction, however, a luminance signal separated from a reproduced video signal is subjected to FM demodulation.

It is known that, in executing FM modulation/demodulation, the high-frequency component of a modulation signal is subjected to emphasis in advance prior to FM modulation at the time of recording, and the high-frequency component of an FM demodulation signal is reduced at the time of reproduction to thereby improve the SN ratio of a luminance signal. The former is called pre-emphasis, and the latter de-emphasis. To perform these processes, therefore, a conventional magnetic recording/reproducing apparatus is provided with a video emphasis circuit generally constituted by an analog filter, i.e., a pre-emphasis circuit and de-emphasis circuit.

Recently, to provide a high-quality image, a digital signal processing technique is applied to a magnetic recording/reproducing apparatus and the pre-emphasis and de-emphasis circuits are realized by a digital filter, particularly, an infinite pulse response (IIR) type digital filter.

The transfer functions of the pre-emphasis and de-emphasis circuits are given by a quotient of a numerator polynomial and a denominator polynomial (hereinafter simply called "numerator" and "denominator"), i.e., by a rational function; the denominator and numerator are typically processed by a single common circuit.

To execute an emphasis process in the order of the denominator and numerator in a common or shared video emphasis circuit, therefore, it is necessary to use a denominator processor with a great dynamic range because the DC component of the signal processed in de-emphasis mode has a large gain. To execute the emphasis process in the order of the numerator and denominator, however, the dynamic range of a numerator processor becomes large because the high-frequency component of the signal processed in pre-emphasis mode has a large gain. This requires a denominator processor with a large dynamic range. Accordingly, irrespective of the order the process is carried out, the denominator processor should have a large dynamic range. When the acquired output signal is binary-transformed, therefore, the number of bits increases and the data processing time becomes long accordingly. This makes it difficult to use, particularly, an IIR type filter which needs a short processing time.

SUMMARY OF THE INVENTION

Accordingly, it is an object of this invention to provide a digital filter which facilitates the digitalization of a denominator processor.

According to one aspect of this invention, there is provided a digital filter having a circuit characteristic represented by a rational function consisting of a denominator polynomial and a numerator polynomial, which filter comprises:

first digital filter means, having a characteristic represented by the denominator polynomial, for processing an input signal in accordance with the characteristic;

second digital filter means, having a characteristic represented by the numerator polynomial and coupled to the first digital filter means, for processing an input signal in accordance with the characteristic; and mode select means, coupled to the first digital filter means and the second digital filter means, for selecting either one of a pre-emphasis mode in which the input signal is subjected to pre-emphasis and a de-emphasis mode in which the input signal is subjected to de-emphasis, whereby in the pre-emphasis mode, the input signal is processed by the first digital filter means and is subsequently processed by the second digital filter means, and in the de-emphasis mode, the input signal is processed by the second digital filter means and is subsequently processed by the first digital filter means.

BRIEF DESCRIPTION OF THE DRAWINGS

The foregoing aspects and other features of the invention will be explained in the following description in connection with the accompanying drawings wherein:

FIGS. 2 and 3 are diagrams illustrating the connections of the circuit shown in FIG. 1 which are determined by its operation mode;

FIG. 4 is a circuit diagram illustrating the structure of an IIR type filter used in the digital filter according to the present invention.

DETAILED DESCRIPTION OF THE PREFERRED EMBODIMENT

Figure 1:
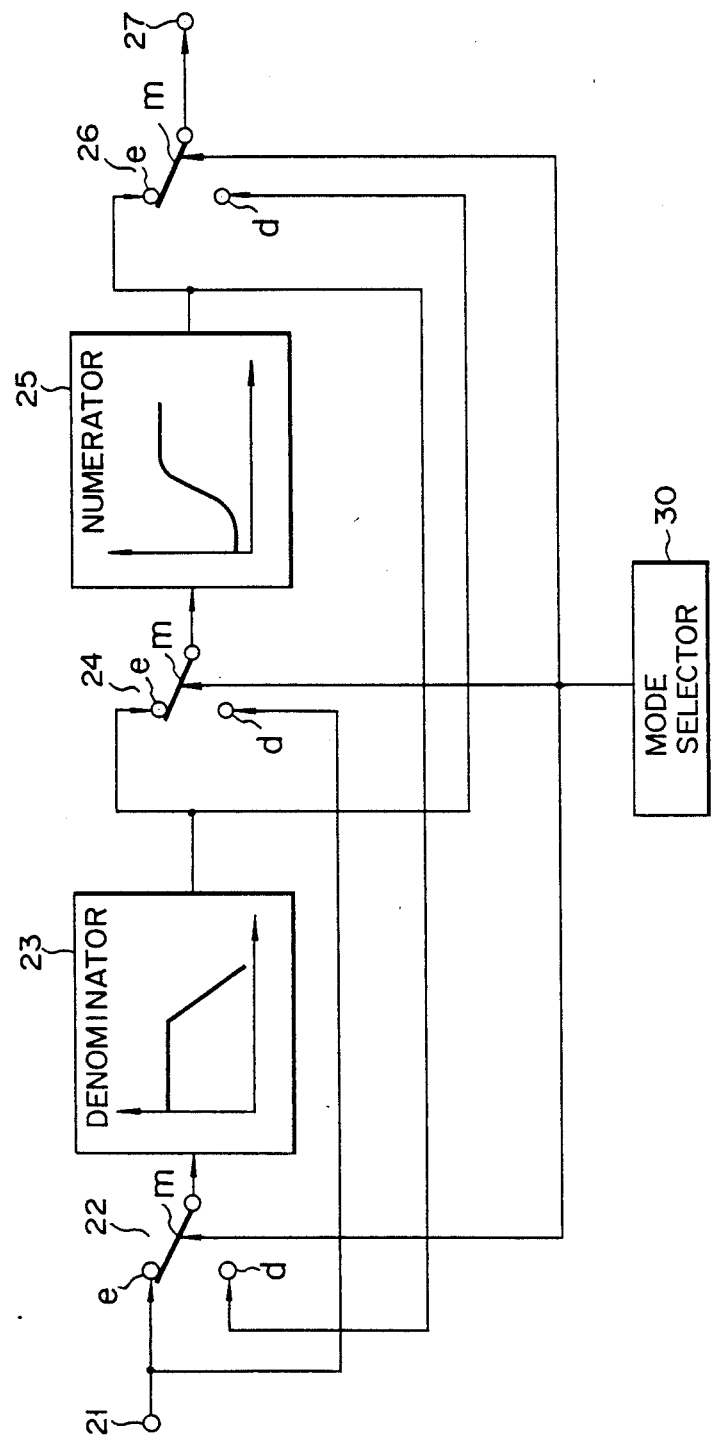
FIG. 1 is a circuit diagram illustrating the structure of a digital filter according to one embodiment of this invention.

A description will now be given of the case where a video emphasis circuit serving as a pre-emphasis circuit and a de-emphasis circuit, both used in a magnetic recording/reproducing apparatus, is realized by a digital filter.

The transfer function of the video emphasis circuit is represented by a rational function. Given that $H_{Emph}(Z)$ is the transfer function of the pre-emphasis circuit and $H_{Demph}(Z)$ is the transfer function of the de-emphasis circuit with their approximate values being acquired by an IIR type filter, since the denominator of $H_{Emph}(Z)$ is $1 + 0.5313Z^{-2}$ and the numerator is $1 - 0.2148Z^{-1} - 0.6785Z^{-2}$, $$H_{Emph}(Z) = \frac{1}{1 + 0.5313Z^{-2}} \times \{1 - 0.2148Z^{-1} - 0.6785Z^{-2}\} \quad (1)$$

Since the denominator of $H_{Demph}(Z)$ is $1+0.9063Z^{-2}$ and the numerator is $1+0.0898Z^{-1} - 0.6875Z^{-2}$, $$H_{Demph}(Z) = \frac{1}{1 + 0.9063Z^{-2}} \times \{1 + 0.0898Z^{-1} - 0.6875Z^{-2}\} \quad (2)$$

In General, the pre-emphasis circuit has a differential characteristic while the de-emphasis circuit has an integral characteristic. The denominators of the two characteristic expressions have an integral characteristic and the numerators thereof have a differential characteristic. It is known that in the integral characteristic, the gain of the DC (direct current) component of a processed signal becomes large, and in the differential characteristic, the gain of the high-frequency component becomes large.

Referring to the following Table 1, a description will now be given of the case where the denominator of the transfer function is processed first and the numerator is then processed.

TABLE 1

| | Mode | | | |
|---|---|---|---|---|
| | Pre-emphasis | | De-emphasis | |
| | Band | | | |
| | DC | High | DC | High |
| Denominator | 6.6 dB | −3.7 dB | 20.6 dB | −5.6 dB |
| Numerator | −20.2 dB | 8.6 dB | −7.9 dB | 8.6 dB |

The Table 1 illustrates the gains of the DC and high-frequency components in the denominator process and numerator process. It should be noted from the Table 1 that the gain of the DC component after the denominator process is particularly large in de-emphasis mode. Therefore, it is necessary to use a denominator processor having a great dynamic range. Accordingly, a numerator processor coupled at the subsequent stage of the denominator processor should also have a great dynamic range.

In the case where the process is executed in the order of the numerator and denominator, however, the gain of the high-frequency component after the numerator process is large in pre-emphasis mode. Accordingly, the level of a signal input to the denominator processor becomes large, so that the dynamic range of the denominator processor should be larger than that of the numerator processor.

A description will be given below of the case where a circuit for processing the denominator is constituted by an IIR type filter. In this case, the process should be completed within one clock period. With regard to a signal processing requiring a high-speed process such as a video signal process, however, the dynamic range often gets large. When the acquired output is binary-transformed, therefore, the number of bits increases and the processing time becomes long as a consequence; it is difficult to complete the process within one clock period ($\frac{1}{4}$ $f_{sc}$=about 70 nsec where $f_{sc}$ is a color subcarrier frequency).

Referring to FIG. 4, this problem will be explained in more detail.

FIG. 4 illustrates the structure of the first-order IIR type filter which comprises registers 11 and 13, an adder 12 and a multiplier 14.

With this circuit arrangement, let us consider a signal processing through a feedback loop constituted by the register 13, multiplier 14, adder 12 and register 13. In this case, it is necessary to execute the multiplication and addition within one clock period or within about 70 nsec; actually, these processes should be executed in about a half this period in consideration of a variation in circuit characteristic. Since the greater the number of bits in data, the greater the number of gates used for the adder 12, however, the delay time in this adder 12 becomes large. Further, since the multiplier 14 is constituted by adders, an increase in delay time with an increase in the number of bits is larger than that of the adder 12.

More specifically, there is a delay time of 11.6 nsec for a 9-bit adder, for example, and a delay time of 13.7 nsec for a 11-bit adder. With regard to the multiplier, as described earlier, the number of stages of internal adders increases with an increase in the number of bits. Accordingly, the difference in the number of output bits is the difference in the number of stages of the internal adders. For instance, if the delay time of a 18-bit (9 by 9) multiplier is 48.2 nsec, then the delay time for a 22-bit (11 by 11) multiplier is 60 nsec. A difference of just 2 bits corresponds to 1/5 of a clock period, so that this delay time is a big problem in realizing the IIR type filter.

A description will now be given of this invention which has been devised to overcome the above problem.

FIG. 1 illustrates the circuit arrangement of one embodiment of this invention.

An input terminal 21 is coupled to one fixed terminal e of a switch 22 as well as to a fixed terminal d of a switch 24. The switch 22 has a movable contact m coupled to an input terminal of a denominator processor 23 constituted by a digital filter. The denominator processor has its output terminal coupled to the other fixed terminal e of the switch 24 as well as to a fixed terminal d of a switch 26.

The switch 24 has a movable contact m coupled to an input terminal of a numerator processor 25 also constituted by a digital filter. The numerator processor 25 has its output terminal coupled to the other fixed terminal e of the switch 26 as well as to a fixed terminal d of the switch 22. Further, the switch 26 has its movable contact m coupled to an output terminal 27. The switches 22, 24 and 26 are further coupled to a mode selector 30.

The operation of thus constituted circuit will be described below. First, either the pre-emphasis mode or de-emphasis mode is selected by the mode selector 30. In pre-emphasis mode, an input luminance signal (hereinafter simply called an input signal) is supplied to the input terminal 21, and in de-emphasis mode, an input luminance signal (hereinafter simply called an input signal) subjected to FM demodulation is supplied to the input terminal 21.

To begin with, the circuit operation in pre-emphasis mode will be described below. The circuit connection in this case is illustrated in FIG. 2; the switches 22, 24 and 26 each have its movable contact m coupled to the fixed terminal e. The input signal to the input terminal 21 is therefore supplied through the switch 22 to the denominator processor 23 as shown in FIG. 2. The input signal is subjected to a predetermined pre-emphasis process in the denominator processor 23 in accordance with the integral characteristic of this processor. The resultant signal is then supplied through the switch 24 to the numerator processor 25 where it is subjected to a predetermined pre-emphasis process in accordance with the differential characteristic of this processor. The processed signal is supplied through the switch 26 to the output terminal 27.

A description will now be given of the circuit operation in de-emphasis mode; the circuit connection in this case is illustrated in FIG. 3. The switches 22, 24 and 26 each have its movable contact m coupled to the fixed terminal d. The input signal, supplied to the input terminal 21 after FM demodulation, is supplied through the switch 24 to the numerator processor 25 as shown in FIG. 3. The input signal is subjected to a predetermined de-emphasis process in the numerator processor 25 in accordance with the differential characteristic of this processor. The resultant signal is then supplied through the switch 22 to the denominator processor 23 where it is subjected to a predetermined de-emphasis process in accordance with the integral characteristic of this processor. The resultant signal is supplied through the switch 26 to the output terminal 27.

Referring now to the Table 1, the dynamic range of the denominator processor 23 will be further described. Let us first consider a process being executed in pre-emphasis mode in the order of the denominator and numerator. As should be obvious from the Table 1, the gain of the DC component and the gain of the high-frequency component after the denominator process are respectively about 6 dB and −4 dB. Therefore, the input signal with the dynamic range being increased by about 1 bit is supplied to the numerator processor 25.

In de-emphasis mode, the gain of the DC component after the numerator process is about −8 dB as shown in the Table 1 and the signal level is attenuated; the gain of the high-frequency component in this case is about 9 dB. Consequently, the input signal with the dynamic range being increased by about 2 bits is supplied to the denominator processor 23. After the denominator process, the gain of the DC component becomes about 21 dB, and the gain of the high-frequency component about −6 dB. This results in an increase by 4 bits in dynamic range. According to this invention, paying attention to the fact that the gain of the DC component after the numerator process is attenuated to about −8 dB, the numerator process is executed prior to the denominator process. By dealing with the denominator, for which the gain of the DC component is large, in this manner, the increase in dynamic range can be suppressed to 3 bits.

According to this invention, in either pre-emphasis mode or de-emphasis mode, the dynamic range of the denominator processor 23 can be made smaller.

A Table 2 given below illustrates the dynamic ranges required for a denominator process when the process sequence in each of the pre-emphasis and de-emphasis modes is changed by the mode selector.

TABLE 2

| Mode | Structure | Frequency | Denominator Input Bits | Denominator Output Bits | Denominator Required Bits |
|---|---|---|---|---|---|
| DE-EMPHASIS | Denominator→ | DC | 9 | 10 | 10 |
|  | Numerator | High | 9 | 9 |  |
|  | Numerator→ | DC | 6 | 7 | 11 |
|  | Denominator | High | 11 | 11 |  |
| PRE-EMPHASIS | Denominator→ | DC | 10 | 15 | 15 |
|  | Numerator | High | 10 | 10 |  |
|  | Numerator→ | DC | 9 | 14 | 14 |

TABLE 2-continued

| Mode | Structure | Frequency | Denominator Input Bits | Denominator Output Bits | Denominator Required Bits |
|---|---|---|---|---|---|
|  | Denominator | High | 12 | 12 |  |

As should be obvious from the Table 2, if the pre-emphasis process is executed in pre-emphasis mode in the order of the denominator and numerator, there is hardly a gain for the high-frequency component. Therefore, execution of the denominator process prior to the numerator process can make the denominator processor 23 have the least required dynamic range irrespective of the gain for the numerator.

In de-emphasis mode, as illustrated in Table 2, execution of the numerator process prior to the denominator process can suppress the gain for the DC component after the denominator process.

As described above, according to this embodiment, in pre-emphasis mode, a denominator having an integral characteristic is processed prior to a numerator having a differential characteristic by using the switches 22 and 24. In de-emphasis mode, the numerator is processed prior to the denominator.

The use of the digital filter according to the present invention can reduce the dynamic range of the denominator processor, which can reduce the number of gates of the numerator processor accordingly.

Although the foregoing description has been given with reference to the particular embodiment, this invention is in no way restricted to this embodiment; it may be modified in various manners within the scope of the invention.

What is claimed is:

1. A digital filter having circuit characteristics represented by a rational function that has a denominator polynomial and a numerator polynomial, said digital filter comprising:
   first digital filter means, having a characteristic represented by said denominator polynomial, for processing a first input signal to said first digital filter means in accordance with said characteristic;
   second digital filter means, having a characteristic represented by said numerator polynomial and coupled to said first digital filter means, for processing a second input signal to said second digital filter means in accordance with said characteristic; and
   mode select means, coupled to said first digital filter means and said second digital filter means, for 1) selecting either one of a pre-emphasis mode in which a third input signal to said digital filter is subjected to pre-emphasis and a pre-emphasis mode in which said third input signal is subjected to de-emphasis, 2) in said pre-emphasis mode, processing said third input signal by said first digital filter means and subsequently processing said third input signal by said second digital filter means, and 3) in said de-emphasis mode, processing said third input signal by said second digital filter means and subsequently processing said third input signal by said first digital filter means.

2. The digital filter according to claim 1, wherein said first digital filter means includes a circuit having an integral characteristic.

3. The digital filter according to claim 1, wherein said second digital filter means includes a circuit having a differential characteristic.

4. The digital filter according to claim 1, wherein said mode select means includes signal supply means for supplying said third input signal to said first digital filter means as said first input signal thereto in accordance with said pre-emphasis mode and supplying an output of said second digital filter means to said first digital filter means as said first input signal in accordance with said de-emphasis mode.

5. The digital filter according to claim 4, wherein said signal supply means includes a switch.

6. The digital filter according to claim 1, wherein said mode select means includes signal supply means for supplying an output of said first digital filter means to said second digital filter means as said second input signal in accordance with said pre-emphasis mode and supplying said third input signal to said second digital filter means as said second input signal in accordance with said de-emphasis mode.

7. The digital filter according to claim 6, wherein said signal supply means includes a switch.

8. The digital filter according to claim 1, further comprising select means for selecting one of an output of said first digital filter means and an output of said second digital filter means.

9. The digital filter according to claim 8, wherein said select means includes a switch.

10. The digital filter according to claim 1, wherein said first digital filter means includes an infinite impulse response (IIR) type filter.

11. The digital filter according to claim 10, wherein said IIR type filter includes registers, an adder and a multiplier.

12. A digital video emphasis circuit comprising:
first digital filter means, having a characteristic represented by a denominator polynomial of a rational function, for processing a first input signal to said first digital filter means in accordance with said characteristic to produce a first process signal;
second digital filter means, having a characteristic represented by a numerator polynomial of said rational function and coupled to said first digital filter means, for processing a second input signal to said second digital filter means in accordance with said characteristic to produce a second process signal;
mode select means for selecting either one of a pre-emphasis mode in which a third input signal to said circuit is subjected to pre-emphasis and a de-emphasis mode in which said third input signal is subjected to de-emphasis;
first supply means for supplying said third input signal to said first digital filter means as said first input signal thereto in accordance with said pre-emphasis mode selected by said mode select means and supplying said second process signal from said second digital filter means to said first digital filter means as said first input signal in accordance with said de-emphasis mode; and
second supply means for supplying said first process signal from said first digital filter means to said second digital filter means as said second input signal in accordance with said pre-emphasis mode selected by said mode select means supplying said third input signal to said second digital filter means in accordance with said de-emphasis mode.

13. The video emphasis circuit according to claim 12, wherein said first digital filter means includes a circuit having an integral characteristic.

14. The video emphasis circuit according to claim 12, wherein said second digital filter means includes a circuit having a differential characteristic.

15. The video emphasis circuit according to claim 12, wherein said first supply means includes a switch.

16. The video emphasis circuit according to claim 12, wherein said second supply means includes a switch.

17. The video emphasis circuit according to claim 12, further comprising select means for selecting one of said first and second process signals.

18. The video emphasis circuit according to claim 17, wherein said select means includes a switch.

19. The video emphasis circuit according to claim 12, wherein said first digital filter means includes an infinite impulse response (IIR) type filter.

20. The video emphasis circuit according to claim 19, wherein said IIR type filter includes registers, an adder and a multiplier.

* * * * *